(12) United States Patent
Shin et al.

(10) Patent No.: US 9,221,297 B2
(45) Date of Patent: Dec. 29, 2015

(54) DUAL SURFACE TREATED INJECTION MOLDING ARTICLE AND METHOD OF MANUFACTURING THE SAME

(75) Inventors: Ho-Soon Shin, Gyeonggi-do (KR); Jong-Bae Park, Gyeongsangbuk-do (KR); Young-Jik Lee, Gyeongsangbuk-do (KR); Hyon-Myong Song, Gyeonggi-do (KR); Ha-Soo Kim, Gyeongsangbuk-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 521 days.

(21) Appl. No.: 13/087,494

(22) Filed: Apr. 15, 2011

(65) Prior Publication Data

US 2011/0253412 A1 Oct. 20, 2011

(30) Foreign Application Priority Data

Apr. 15, 2010 (KR) ........................ 10-2010-0034688

(51) Int. Cl.
| | | |
|---|---|---|
| *B32B 3/10* | (2006.01) | |
| *B44F 7/00* | (2006.01) | |
| *B44F 1/04* | (2006.01) | |
| *C23C 14/04* | (2006.01) | |

(52) U.S. Cl.
CPC . *B44F 7/00* (2013.01); *B44F 1/045* (2013.01); *C23C 14/042* (2013.01); *Y10T 428/24802* (2015.01); *Y10T 428/24851* (2015.01); *Y10T 428/24868* (2015.01); *Y10T 428/24917* (2015.01)

(58) Field of Classification Search
USPC ......................................................... 428/195.1
See application file for complete search history.

(56) References Cited

U.S. PATENT DOCUMENTS

| | | | | |
|---|---|---|---|---|
| 5,786,910 A | * | 7/1998 | Walters et al. .................... 359/2 |
| 5,815,292 A | * | 9/1998 | Walters ............................ 359/2 |
| 6,490,819 B1 | * | 12/2002 | Kumata et al. .................. 40/615 |
| 6,946,162 B2 | | 9/2005 | Halot et al. |
| 2003/0058491 A1 | * | 3/2003 | Holmes et al. ................... 359/2 |
| 2005/0181184 A1 | * | 8/2005 | Obermann ................. 428/195.1 |
| 2007/0095929 A1 | * | 5/2007 | Cote et al. ...................... 235/494 |

FOREIGN PATENT DOCUMENTS

| | | | |
|---|---|---|---|
| EP | 10-2004-054046 A1 | 5/2006 | |
| EP | 2151308 A1 | 2/2010 | |
| FR | 2205006 A5 | 5/1974 | |
| FR | 2930193 A1 | 10/2009 | |
| KR | 20-0431796 | 11/2006 | ............. B29C 45/14 |
| KR | 2006-117076 | 11/2006 | ............. A44C 25/00 |
| KR | 2009-78773 | 7/2009 | ................ C09J 7/02 |
| KR | 10-2010-0107973 A | 10/2010 | |

* cited by examiner

*Primary Examiner* — David Sample
*Assistant Examiner* — Christopher Polley
(74) *Attorney, Agent, or Firm* — Cha & Reiter, LLC.

(57) ABSTRACT

Disclosed are a dual surface-treated injection molding article, which is manufactured by dually surface-treating an injection molding substrate formed of a light-transmissive semi-transparent or transparent material in such a manner that a metallic appearance is expressed or any of a logo, a pattern, an ornamental design, and a picture is formed on each of inner and outer surfaces of the injection molding substrate, and a method of manufacturing the same.

5 Claims, 4 Drawing Sheets

DUAL SURFACE TREATED INJECTION MOLDING ARTICLE AND METHOD OF MANUFACTURING THE SAME

CLAIM OF PRIORITY

This application claims the priority under 35 U.S.C. §119 of an application entitled "Dual Surface Treated Injection Molding Article And Method Of Manufacturing The Same" filed in the Korean Intellectual Property Office on Apr. 15, 2010 and assigned Serial No. 10-2010-0034688, the contents of which are hereby incorporated by reference.

BACKGROUND OF THE INVENTION

1. Field of the Invention

The present invention relates to a dual surface-treated injection molding article and a method of manufacturing the same.

2. Description of the Related Art

In general, an injection molding article comprises a synthetic resin article manufactured in a shape corresponding to a mold by pouring a molten resin into the mold. Since it is easy to mass-produce such injection molding articles, they are widely utilized as casings for many consumer electronic appliances.

For example, injection molding articles are employed for producing cosmetic containers, game machines, portable terminals, such as mobile phones, etc. The evolving trend in modern portable products is that they serve as fashionable items for users. Due to this trend, portable terminal users sometimes decorate their portable terminals using a third party portable pouch, or a case directly mountable to the terminal.

According to various demands of such users, efforts are being made so as to diversify the cases' external appearances of portable appliances by phone manufacturers. For example, such efforts include: merely diversifying products' colors; performing post-processing surface treatment, such as painting, vapor deposition, printing, or plating, etc. to vary the color of casing; and performing insert mold labeling (IML) so as to coat a separate film onto a product when the product is molded. Further, separately manufactured pattern stickers are available to attach onto the injection molding articles.

By providing ornamental elements as mentioned above, new visual effects can be provided to the external appearances of portable appliances.

As shown in FIG. 1, a conventional surface-treated injection molding article has a paint layer 2 formed on a main surface of an injection molding substrate 1 formed from an opaque material, and a colored area, a logo, a pattern, an ornamental design, and a picture 3 formed in the paint layer 2. However, such a conventional injection molding article formed from an opaque material exhibits a poor durability without the use of paint layer (protection layer) 2, and has a limitation in implementing a stereographic appearance of designed ornamental elements, such as a colored area, a logo, a pattern, an ornamental design, and a picture 3.

The conventional injection molding article is formed with a pattern on one side thereof by processing an injection molding substrate, using a mold having a corresponding pattern, and then surface-treating the injection molding substrate by forming a paint layer once only. As a result, there is a limitation in implementing such a pattern in depth, and also it is difficult to form a logo, a pattern, an ornamental design, a picture, etc. precisely.

Therefore, what is needed is to provide a method which can implement a metallic appearance or a stereographic appearance of a logo, a pattern, an ornamental design, a picture or the like more in depth on the final injection molding article.

SUMMARY OF THE INVENTION

Accordingly, the present invention has been made to solve the above-mentioned problems occurring in the prior art and provides additional advantages, by providing a dual surface-treated injection molding article and a method of manufacturing the same, wherein the dual surface-treated injection molding article is manufactured by dually surface-treating an injection molding substrate formed from a light-transmissive semi-transparent or transparent material in such a manner that a metallic appearance is expressed or any of a logo, a pattern, an ornamental design and a picture is formed on each of the inner and outer surfaces of the injection molding substrate, so that a metallic appearance or a stereographic appearance of the logo, the pattern, the ornamental design and the picture can be implemented more deeply, thereby enhancing stereographic visual effects on the resultant final injection molding article.

In accordance with an aspect of the present invention, a dual surface-treated injection molding article includes: a first physical vapor deposition layer formed on the inner surface of an injection molding substrate which is formed from a light-transmissive semi-transparent or transparent material; a first physical vapor deposition layer formed on the inner surface of the injection molding substrate; a first print layer formed by etching or removing the first physical vapor deposition layer; a first paint layer formed on the inner surface of the injection molding substrate; a masking layer formed on the outer surface of the injection molding substrate; a second physical vapor deposition layer formed on the outer surface of the injection molding substrate at an area exposed through the masking layer; a second print layer formed by etching or removing the masking layer; and a second paint layer formed on the outer surface of the injection molding substrate.

In accordance with another aspect of the present invention, a method of manufacturing a dual surface-treated article includes: forming a first physical vapor deposition layer on the inner surface of an injection molding substrate which is formed from a light-transmissive semi-transparent or transparent material; forming a first print layer by etching or removing the first physical vapor deposition layer; forming a first paint layer on the inner surface of the injection molding substrate; forming a masking layer on the outer surface of the injection molding substrate; forming a second physical vapor deposition layer on the outer surface of the injection molding substrate at an area exposed though the masking layer; forming a second print layer at an area by etching or removing the masking layer; and forming a second paint layer on the outer surface of the injection molding substrate.

BRIEF DESCRIPTION OF THE DRAWINGS

The above and other aspects, features and advantages of the present invention will be more apparent from the following detailed description taken in conjunction with the accompanying drawings, in which.

DETAILED DESCRIPTION OF THE INVENTION

Hereinafter, embodiments of the present invention will be described with reference to the accompanying drawings. In this regards, it shall be appreciated that the embodiments described herein and the constructions show in the accompanying drawings merely illustrate the most desired embodiments of the present invention, and various modified embodiments can be made within the scope of the present invention.

Figure 1:
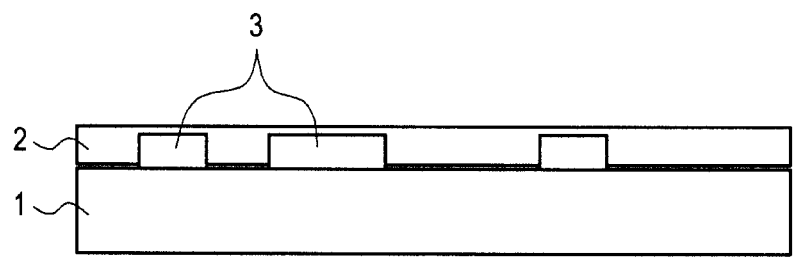
FIG. 1 is a cross-sectional view showing a conventional dual surface-treated injection molding article.
Figure 2:
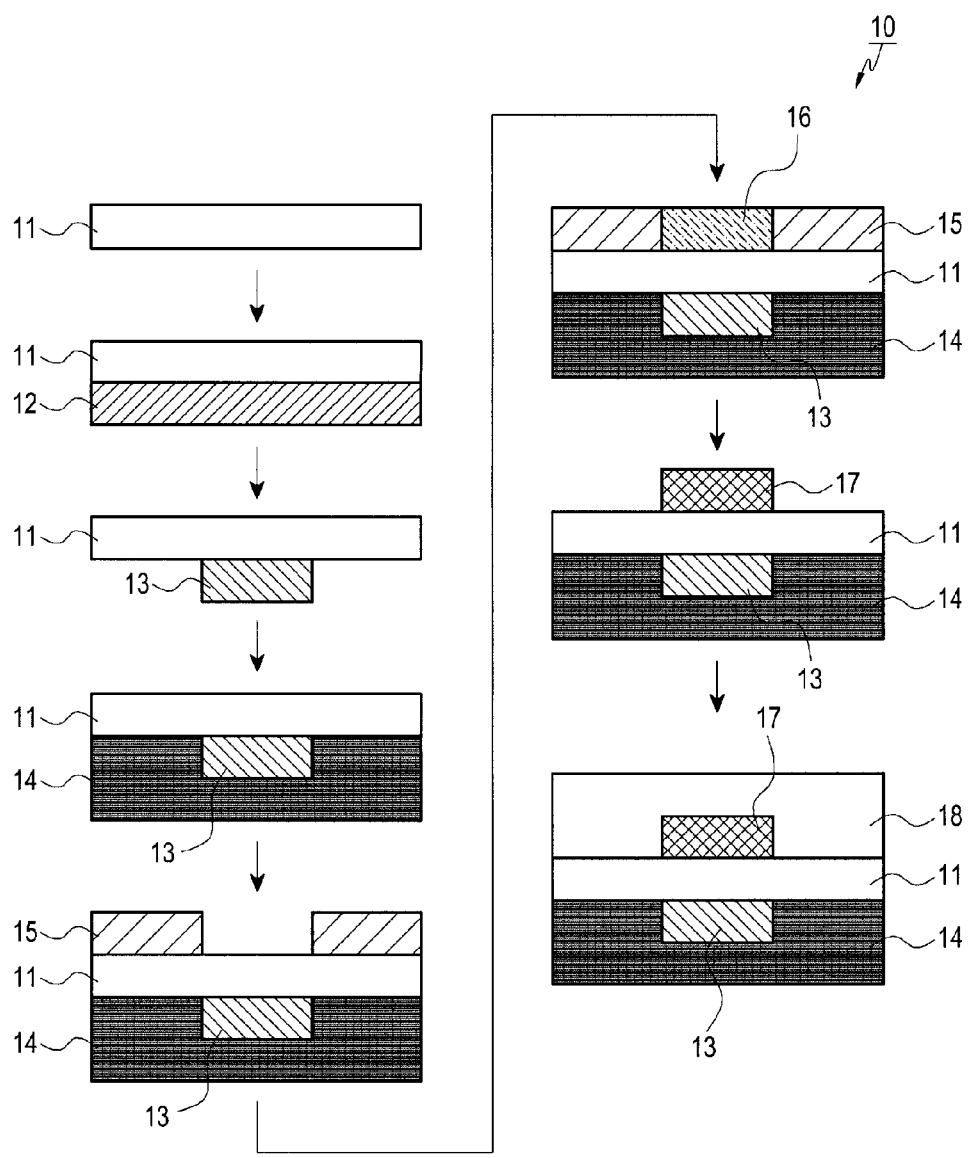
FIG. 2 shows a process for manufacturing a dual surface-treated injection molding article in accordance with an embodiment of the present invention.
Figure 3:
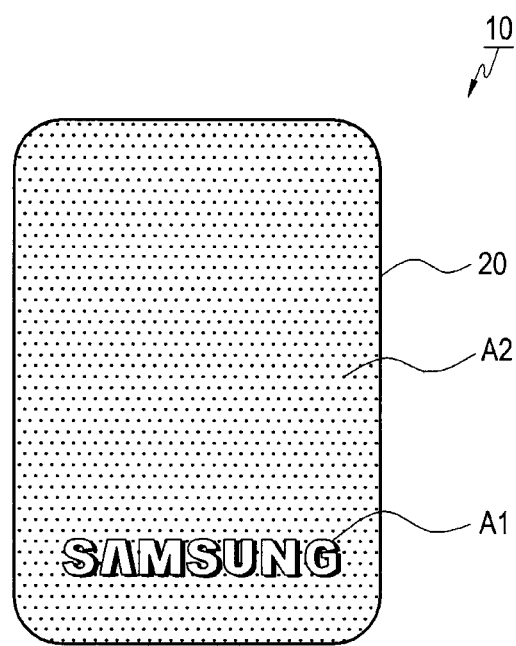
FIG. 3 shows a dual surface-treated injection molding article in accordance with an embodiment of the present invention.

Referring to FIGS. 2 and 3, a dual surface-treated injection molding article 10 includes: an injection molding substrate 11 formed of a light-transmissive semi-transparent or transparent material; first and second PVD (Physical Vapor Deposition) layers 12 and 16; first and second print layers 13 and 17; first and second paint layers 14 and 18; and a masking layer 15, wherein the injection molding substrate 11 is formed by injection-molding the light-transmissive semi-transparent or transparent material to an external appearance of a portable communication device 20.

As shown in FIGS. 2 and 3, the first PVD layer 12 is formed on the inner surface of the injection molding substrate 11 so as to form the first print layer 13 on the injection molding substrate 11, the first print layer 13 is adapted to be formed by etching or removing the first PVD layer 12 through an etching process or by using a laser (not shown). The first paint layer 14 is formed on the inner surface of the injection molding substrate 11 so as to protect the first print layer 13.

The masking layer 15 is formed on the outer surface of the injection molding substrate 11 so as to form the second PVD layer 16. The second PVD layer 16 is formed at an area exposed through the masking layer 15 so as to form the second print layer 17, wherein the second print layer 17 is adapted to be formed by etching or removing the masking layer 15 through an etching process or by using a laser (not shown). The second paint layer 18 is formed on the outer surface of the injection molding substrate 11 so as to protect the second print layer 17.

Each of the first and second PVD layers 12 and 16 is preferably formed by depositing tin (Sn) or aluminum (Al) so as to provide a metallic appearance. However, in addition to Sn and Al, the first and second PVD layers 12 and 16 may be formed by other metal (e.g., nickel (Ni) and silicon (Si)).

The first and second print layers 13 and 17 may include any of a logo (A1) and a pattern (A2) as show in FIG. 3, and may include other forms of logos, patterns, ornamental designs, and pictures (e.g., symbols and numeric characters), thus providing a three-dimensional or depth perception.

In the embodiment, the first paint layer 14 may be formed by a black-series color so as to hide the internal parts of the final product, and the second paint layer 18 may be formed from a transparent color so as to show the stereographic appearance of the first and second print layers 13 and 17.

The masking layer 15 is formed to expose an area opposite to the first print layer 13, wherein the second PVD layer 16 is formed at the area exposed through the masking layer 15 to correspond to the first print layer 13.

As shown in FIG. 3, the inventive dual surface-treated injection molding article 10 according to the teachings of the present invention described above may be applicable to the portable communication device 20. However, the portable communication device 20 is not necessarily limited to a mobile communication terminal, and the inventive dual surface-treated injection molding article 10 is applicable to various types of terminals (e.g., bar-type, folder type and slide-type terminals).

Further, in addition to all types of mobile communication terminals operated by various communication protocols to which the present invention is applicable, the teachings of the present invention may be applicable to other portable communication 25 devices which include ding information communication appliances, multimedia appliances and their applications, such as digital cameras, PMPs (Portable Multimedia players), MP3 players, navigation units, game machines, notebook personal computers, sign boards, TV sets, digital broadcasting players, PDAs (Personal Digital Assistants), and smart phones.

Now, a process of manufacturing a dual surface-treated injection molding article having the above-mentioned construction will be described in more detail with reference to FIGS. 2 and 3.

As shown in FIGS. 2 and 3, an injection molding substrate 11 is injection-molded to be suitable for the external appearance of a portable communication device 20 using a light-transmissive semi-transparent or transparent material.

In this state, a first PVD layer 12 is formed on the inner surface of the injection molding substrate 11 so as to provide a metallic appearance of the injection molding article, wherein the first PVD layer 12 is formed by depositing tin (Sn) or aluminum (Al).

In this state, the first PVD layer 12 is etched or removed through an etching process or by using a laser, so as to form a first print layer 13 on the inner surface of the injection molding substrate 11.

The first print layer 13 may include any of a logo A1, a pattern A2, an ornamental design, and a picture. FIG. 3 shows the logo A1 and the pattern A2.

Then, a first paint layer 14 is formed on the inner surface of the injection molding substrate 11 so as to protect the first print layer 13.

The first paint layer 14 is formed by a black-series color.

At this time, the metallic appearance or stereographic appearance of the first print layer 14 is visually seen primarily through the injection molding substrate 11 which is formed from the semi-transparent or transparent material.

In this state, a masking layer 15 is formed on the outer surface of the injection molding substrate to expose an area opposite to the first print layer 13, as shown in FIG. 2.

On the outer surface of the injection molding substrate 11, a second PVD layer 16 is formed at the area exposed through the masking layer 15.

The second PVD layer 16 is formed to correspond to the first print layer 13.

Then, the masking layer 15 is etched or removed through an etching process or by using a laser (not shown), and a second print layer 17 is formed on the outer surface of the injection molding substrate 11.

The second print layer 17 may include any of a logo A1, a pattern A2, an ornamental design and a picture. FIG. 3 shows a logo A1 and a pattern A2.

In this state, a second paint layer 18 is formed on the outer surface of the injection molding substrate 11 so as to protect the second print layer 17.

The second paint layer 18 is formed by a transparent color so that the first and second print layers 13 and 17 are visible to the outside.

In a state in which the metallic appearance or stereographic appearance of the first print layer 13 is visually seen primarily through the injection molding substrate formed from a semi-transparent or transparent material, the metallic appearance or stereographic appearance of the second print layer 17 is visually seen secondarily through the second paint layer 18.

By performing dual surface-treatment on an injection molding substrate formed from a light-transmissive semi-transparent or transparent material as described above, it should be apparent to those skilled in the art that the inventive process provides an enhanced metallic appearance or a stereographic appearance of a logo, pattern, an ornamental design, and a picture in more depth in the final product.

Hereinafter, a method of manufacturing a dual surface-treated injection molding article as described above will be described in more detail with reference to FIG. 4.

Figure 4:
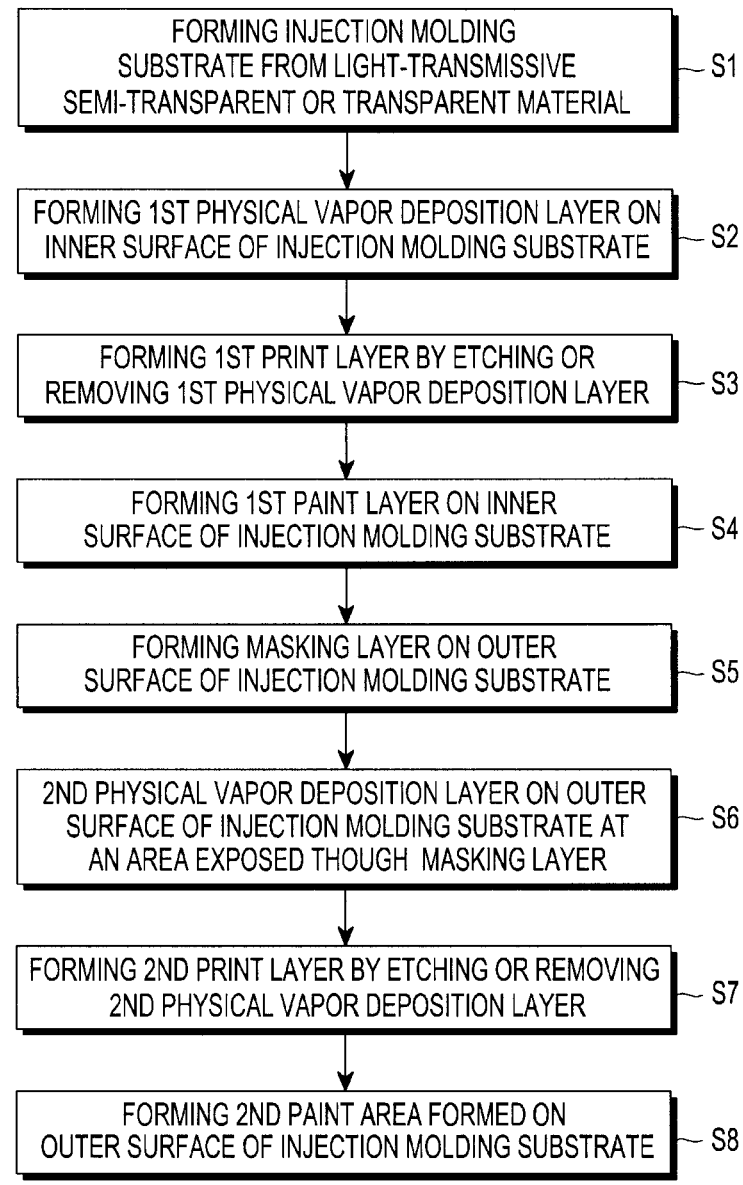
FIG. 4 is a flowchart showing a process of manufacturing a dual surface-treated injection molding article in accordance with an embodiment of the present invention.

As shown in FIG. 4, an injection molding substrate 11 is injection-molded to correspond to an external appearance of a portable communication device 20 using a light transmissive semi-transparent or transparent material (S1).

Then, a first PVD layer 12 is formed on the inner surface of the injection molding substrate 11 so as to provide a metallic appearance of the injection molding substrate 11 (S2).

The first PVD layer 12 is formed by depositing tin (Sn) or aluminum (Al).

Then, the first PVD layer 12 is etched or removed through an etching process or by using a laser, so as to form a first print layer 13 on the inner surface of the injection molding substrate 11 (S3).

The first print layer 13 may include any of a logo A1, a pattern A2, an ornamental design and a picture. FIG. 3 shows the logo A1 and the pattern A2.

Then, a first paint layer 14 is formed on the inner surface of the injection molding substrate 11 so as to protect the first print layer 13 (S4).

The first paint layer 14 is formed by a black-series color.

At this time, the metallic appearance or the stereographic appearance of the first print layer 14 is visually seen primarily through the injection molding substrate 11 which is formed from a semi-transparent or transparent material.

Then, a masking layer 15 is formed on the outer surface of the injection molding substrate at an area exposed through the first print layer 13 (S5).

On the outer surface of the injection molding substrate 11, a second PVD layer 16 is formed at an area exposed through the masking layer 15 (S6).

The second PVD layer 16 is formed to correspond to the first print layer 13.

Then, the masking layer 15 is etched or removed through an etching process or by using a laser (not shown), and a second print layer 17 is formed on the outer surface of the injection molding substrate 11 (S7).

The second print layer 17 may include any of a logo Al, a pattern A2, an ornamental design and a picture. FIG. 3 shows a logo Al and a pattern A2.

Then, a second paint layer 18 is formed on the outer surface of the injection molding substrate 11 so as to protect the second print layer 17 (S8).

The second paint layer 18 is formed by a transparent color so that the first and second print layers 13 and 17 are visible to the outside.

In a state in which the metallic appearance or stereographic appearance of the first print layer 13 is visually seen primarily through the injection molding substrate formed from a semi-transparent or transparent material, the metallic appearance or stereographic appearance of the second print layer 17 is visually seen secondarily through the second paint layer 18.

By performing dual surface-treatment on an injection molding substrate formed from a light-transmissive semi-transparent or transparent material as described above, it is possible to implement an enhanced metallic appearance or a stereographic appearance of a logo, pattern, an ornamental design, and a picture in more depth in the final product.

While the invention has been shown and described with reference to certain embodiments thereof, it will be understood by those skilled in the art that various changes in form and details may be made therein without departing from the spirit and scope of the invention as defined by the appended claims.

What is claimed is:

1. A portable communication device, comprising a housing that is formed of
    an injection molding substrate formed from at least one of a translucent or transparent material;
    a first print layer formed on an inner surface of the injection molding substrate, the first print layer forming a first print;
    a first opaque paint layer formed on the inner surface of the injection molding substrate, the first paint layer covering the first print layer; and
    a second print layer formed on an outer surface of the injection molding substrate, the second print layer forming a second print, the second print being aligned with the first print, so that the first print and the second print are coincident with one another,
    wherein the first print and the second print each define the same design,
    wherein the design includes at least one of a logo, a pattern, an ornamental design, and a picture, and
    wherein at least one the first print layer and the second print layer is formed of silicon.

2. The portable communication device of claim 1, wherein the first and second print layers are formed by using an etching process or by using a laser.

3. The portable communication device of claim 1, wherein the first paint layer includes a black-series paint.

4. The portable communication device of claim 1, further comprising a second paint layer formed on the second print layer.

5. The portable communication device of claim 4, wherein the second print layer is formed in portions of the outer surface that are situated opposite the first print layer.

\* \* \* \* \*

UNITED STATES PATENT AND TRADEMARK OFFICE
CERTIFICATE OF CORRECTION

| | | |
|---|---|---|
| PATENT NO. | : 9,221,297 B2 | Page 1 of 1 |
| APPLICATION NO. | : 13/087494 | |
| DATED | : December 29, 2015 | |
| INVENTOR(S) | : Ho-Soon Shin et al. | |

It is certified that error appears in the above-identified patent and that said Letters Patent is hereby corrected as shown below:

IN THE CLAIMS

Column 6, Claim 1, Lines 24-25 should read as follows:
--...formed of: an injection...--

Column 6, Claim 1, Line 42 should read as follows:
--...least one of the...--

Signed and Sealed this
Eighth Day of March, 2016

Michelle K. Lee
*Director of the United States Patent and Trademark Office*